United States Patent
Abraham et al.

(10) Patent No.: US 6,593,241 B1
(45) Date of Patent: Jul. 15, 2003

(54) METHOD OF PLANARIZING A SEMICONDUCTOR DEVICE USING A HIGH DENSITY PLASMA SYSTEM

(75) Inventors: Thomas Abraham, Scotts Valley, CA (US); James Allan Bondur, San Jose, CA (US); James Paul Garcia, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 561 days.

(21) Appl. No.: 09/075,854

(22) Filed: May 11, 1998

(51) Int. Cl.[7] ............................................. H01L 21/311
(52) U.S. Cl. .................................................... 438/697
(58) Field of Search ................... 438/690, 697, 438/723

(56) References Cited

U.S. PATENT DOCUMENTS

| | | | |
|---|---|---|---|
| 4,872,947 A | * 10/1989 | Wang et al. | 159/643 |
| 4,952,274 A | 8/1990 | Abraham | 156/643 |
| 5,128,279 A | * 7/1992 | Nariani et al. | 437/195 |
| 5,365,104 A | 11/1994 | Godinho et al. | 257/529 |
| 5,494,854 A | * 2/1996 | Jain | 437/195 |
| 5,602,056 A | * 2/1997 | Jain et al. | 437/195 |
| 5,679,606 A | * 10/1997 | Wang et al. | 437/195 |
| 5,728,631 A | * 3/1998 | Wang | 438/787 |

OTHER PUBLICATIONS

Wolf, S., Et al., Silicon Processing for the VLSI Era, vol. 1: Process Technology, Lattice Press, Sunset Beach, Calif., USA, p. 546, 1986.*

* cited by examiner

Primary Examiner—Benjamin L. Utech
Assistant Examiner—Matthew Anderson
(74) Attorney, Agent, or Firm—Moser, Patterson & Sheridan

(57) ABSTRACT

A method for planarizing a layer of material on a semiconductor device is disclosed, which planarizes a layer on a semiconductor device using a high density plasma system, and uses a sacrificial layer having a desirable etch to deposition rate. Additionally, the method for planarizing a layer can be easily incorporated into the semiconductor fabrication process, and is capable of achieving both local and global planarization.

28 Claims, 3 Drawing Sheets

METHOD OF PLANARIZING A SEMICONDUCTOR DEVICE USING A HIGH DENSITY PLASMA SYSTEM

BRIEF DESCRIPTION OF THE INVENTION

This invention relates generally to fabrication of semiconductor devices. More particularly, the invention relates to a method for planarizing a layer of material on a semiconductor device using a high density plasma system.

BACKGROUND OF THE INVENTION

Manufacturing of integrated circuits is becoming increasingly complex as the device density in such circuits increases. Highly dense circuits require closely spaced metal interconnect lines or features and multiple layers of materials and structures, all in micron and sub-micron dimensions. The surface of the layer will have a topography which generally conforms to the sublayer. The prior structures and layers create surface topography with areas of irregular elevation, troughs and the like. As the layers increase, the irregularities become more pronounced. Such topography adversely effects the fine pattern resolution and depth-of-focus limitations required for lithography, deposition of films, etching of interconnect lines and the overall yield and performance of the integrated circuit. Consequently it is desirable to planarize the layers to minimize such irregularities in the topography of the surface.

Planarization is a process used to create smooth, planar layers on wafers. There are two types of planarization required in the fabrication of semiconductors with multiple levels of metal interconnects; namely local and global planarization. Local planarization involves planarizing a dielectric film or layer deposited over dense arrays of interconnect metals. Global planarization is where the dielectric layer over the whole wafer is planarized.

For global planarization, Chemical Mechanical Polishing (CMP) is the most commonly used technique of planarization which essentially provides for polishing a wafer by rubbing a polishing pad against the wafer to grind the surface layer. Often, the polishing pad is saturated with an abrasive slurry solution which may aid the planarization. A commonly used slurry is colloidal silica in an aqueous KOH solution. CMP tools are well known in the art. The tools include a polishing wheel with the wafer attached. As the wheel rotates the wafer is forced against a wetted polishing surface and the surface of the wafer is planarized.

CMP has a number of limitations. It is a separate step requiring dedicated, and often times costly, equipment. There is no way to measure film removal rate during CMP. CMP rate and uniformity are influenced by pad conditions and pressure on the wafer. Additionally, the total planarization achievable with CMP is limited in terms of the step height of the metal interconnects or features. As device geometries shrink the demands on global planarization increase due to decreasing depth of focus of lithography steppers used to achieve such small geometries.

It has recently been found that high density plasma (HDP) chemical vapor deposition (CVD) processes used to deposit dielectric films such as gap fill oxides, and other layers, can be used in an attempt to achieve planar layers. One such method is described in U.S. Pat. No. 5,494,854. The '854 patent discloses the steps of depositing a HDP silicon dioxide gap fill dielectric layer over conductors to planarized high aspect ratio conductors, but the method does not necessarily planarize low aspect ratio conductors. A sacrificial polish layer is then deposited and a CMP process is used to planarize this sacrificial layer.

The '854 patent requires the use of a CMP process to complete the planarization process. As described above, the CMP process has limitations, and increases costs associated with performing this additional, independent step. Thus, it is desirable to provide an improved method of planarizing a layer of material on a semiconductor device or wafer that provides a planar layer and overcomes the aforementioned limitations. Specifically it is desirable to provide a method of planarizing that does not require additional steps and/or equipment such as CMP and spin on glass techniques, but is capable of providing in-situ planarizing.

OBJECTS AND SUMMARY OF THE INVENTION

Accordingly, it is an object of this invention to provide an improved method for planarizing a layer of material on a semiconductor device.

More particularly, it is an object of the present invention to provide an in-situ method for planarizing a layer on a semiconductor device using a high density plasma system.

Another object of the present invention is to provide a method of planarizing a layer using a sacrificial layer having a desirable etch rate difference compared to the gap fill layer.

A further object herein is to provide a method for planarizing a layer which can be easily incorporated into the semiconductor fabrication process.

Yet another objective of the present invention is to provide a planarization method capable of achieving both local and global planarization.

These and other objects are achieved by the method herein disclosed of forming a planar layer on a semiconductor device, having interconnect features, in a high density plasma CVD reactor which has a wafer support that may be biased by applying rf bias to provide sputter etching. The method comprises the steps of: depositing a gap fill oxide layer atop the interconnect features and substrate wherein angled facets are formed in the gap fill oxide above the interconnect features. Next, a sacrificial layer is deposited atop the gap fill oxide layer. The sacrificial layer has an etch to deposition ratio that is equal to or greater than the gap fill oxide at a given rf bias, and during this second depositing step the angled facets are etched at a rate greater than the rest of the layer, thereby causing the facets to substantially recede. The sacrificial layer is then etched to substantially remove the sacrificial layer and provides a substantially planar layer with a device specific thickness over the underlying metal. In one embodiment the sacrificial layer is sputter etched by a suitable sputter etching species or a combination of sputter etching species. In a second embodiment, the sacrificial layer is etched using a combination of sputter etching and chemical etching with a suitable sputter etching species, and a chemical etchant, respectively.

In an alternative embodiment, a "topcoat" may be deposited atop the semiconductor device after the sacrificial layer is etched to provide further planarization.

BRIEF DESCRIPTION OF THE DRAWINGS

Other objects and advantages of the invention become apparent upon reading of the detailed description of the invention provided below and upon reference to the drawings, in which.

DETAILED DESCRIPTION OF THE INVENTION

Figure 4:
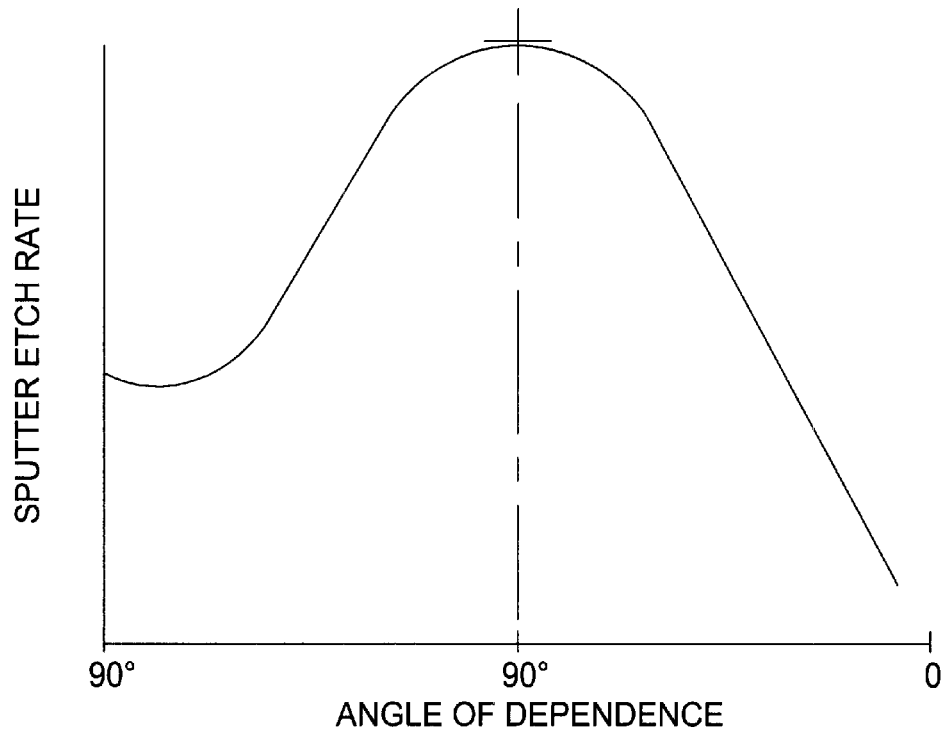
FIG. 4 is a graph showing the sputter etch rate as a function of the angle of dependence for topography of a layer deposited over interconnects on a semiconductor device.

The present invention provides a method of in-situ planarization of a layer of material on a semiconductor device using high density plasma chemical vapor deposition (HDP CVD) techniques. A gapfill dielectric layer is deposited over metal interconnects, followed by deposition of a sacrificial layer, and etch back of the sacrificial layer to provide a substantially planar surface. The etch back step may be performed by sputter etching or by a combination of sputter etching and chemical etching. In an alternative embodiment, an overcoat layer may be deposited atop the surface to provide further planarization. The inventive method is preferably practiced in a HDP CVD reactor known in the art, however, other plasma assisted CVD reactors may be used that provide low pressure operation with a rf biasable wafer support. An example of a HDP CVD reactor that may be used to practice the invention is described in U.S. Pat. No. 5,792,273, incorporated herein by reference. In general, the HPD CVD process is a relatively new technique which employs a high density plasma source to generate a plasma with a high density of ions, on the order of greater than $10^{11}$ ions/cm$^3$. The HDP CVD reactor employs a biased wafer support which may be biased by applying rf bias power to the support at a preferred frequency to enhance the sputter rates resulting from ion bombardment. This sets up a bias voltage at the wafer, which acts to accelerate ions to the surface of the wafer or substrate secured by the wafer support. The wafer is cooled by supplying helium to the backside of the wafer (often referred to as "backside helium"). During deposition of a film such as a gapfill layer, the wafer support is typically biased, causing ions to strike the surface and sputter etch away material as it is deposited. This process results in good quality gapfill layers that can fill gaps with high aspect ratios without forming voids. This phenomenon can be characterized in part by an etch to deposition ratio (E/D). The E/D is determined by the equation:

$$E/D = (UB\ \text{rate} - B\ \text{rate})/UB\ \text{rate}$$

where UB rate is the rate of deposition of a film on the wafer surface when the wafer support is not biased, and B rate is the rate of deposition of a film on the wafer surface when the wafer support is biased. Thus, there is a sputter etch component and a deposition component present in a HDP CVD process. The inventors have found that the E/D ratio is a measure of the planarizing capability of the deposition process. Moreover, the sputter etch rate of the layer when the ions bombard the surface of the layer plays a role in facet formation. It is known that the sputter etch rate varies as a function of the topology of the wafer, specifically with the angle of the topology of the layer, and that the sputter etch rate is highest at an angle in the range of approximately 45 to 60 degrees as shown in FIG. 4. As a result, the etch rate of the facets 20 and 22 (to be described in FIG. 1A below) can be 2 to 3 times greater than the etch rate of the layer at 90 degrees to the surface of the substrate, i.e. where the ions sputter incident to the surface. The inventors have also discovered that the sputter etch rate varies for different materials and is a function of the composition (or stoichiometry) of the dielectric film being deposited. It is also possible to use chemical etching gases in the plasma to generate a chemical component to the etching, which could facilitate the lateral etch component of the aforementioned facet. This chemical etch component could help remove the top hats above the wider features (i.e. >1 μm) to lead to a more complete global planarization as well as to enhance the etch rate to reduce the planarization time.

Figure 1A:
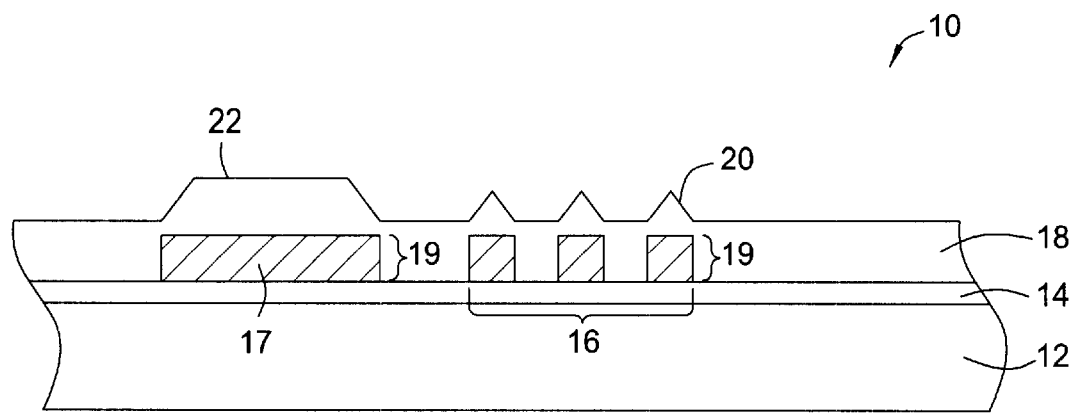
FIGS. 1A, 1B, 1C are cross-sectional views of a semiconductor wafer, having patterned interconnects and illustrating the processing steps according to one embodiment of the method of the present invention.
Figure 1B:
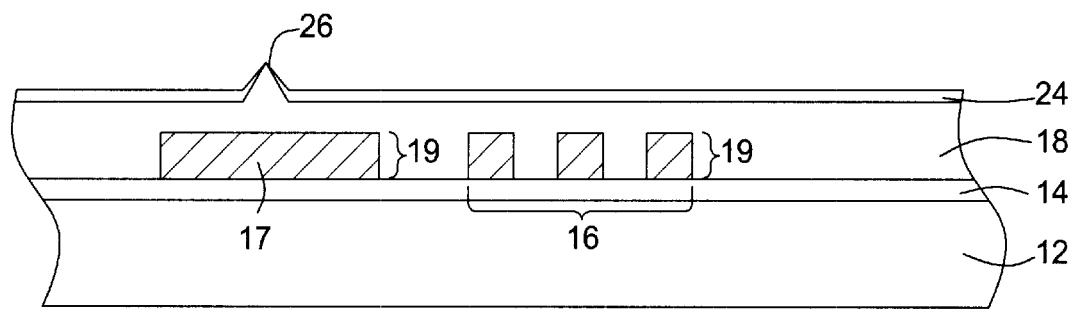
Figure 1C:
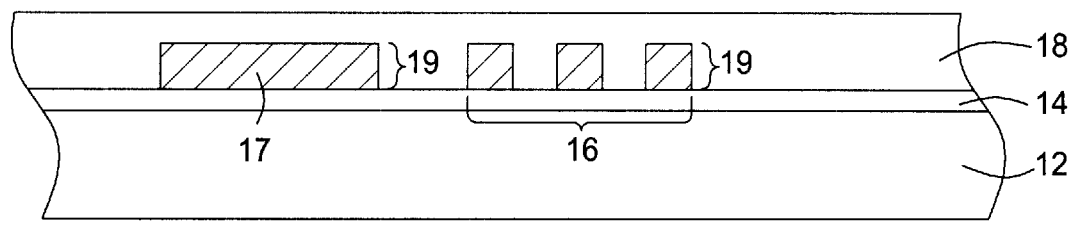

Turning to the drawings, wherein like components are designated by like reference numbers in the figures, FIGS. 1A–1C show a semiconductor device 10 which includes a substrate 12, and an oxide layer (sometimes referred to as a premetal deposition layer) 14, and device structures below the oxide 14. Preferably, the oxide layer 14 is made of silicon dioxide, a plurality of interconnects or circuit features 16 and 17 are formed atop the oxide layer 14. The interconnects may vary in width and aspect ratio. Narrow 16 and wide 17 interconnects are shown in the figures. The interconnects contain a step 19, that is a step height from the bottom surface to the top surface of the feature. The circuit features 16 and 17 can be of any type known in the art such as polysilicon gates, drains, metal plugs, lightly doped drain (LDD) spacers, interconnecting lines and the like. The circuit features are formed using fabrication steps well known in the art. In the exemplary embodiment, circuit features 16 and 17 are metal interconnect lines.

After the interconnects 16 and 17 are fabricated, a gapfill dielectric oxide layer 18 is deposited atop the substrate and interconnects 16 and 17. Preferably, the gapfill dielectric layer 18 is formed by HDP chemical vapor deposition (CVD). The gapfill oxide layer 18 is formed until the interconnects 16 and 17 are covered or until the layer 18 reaches a desired thickness above the interconnects. The gapfill oxide will have a surface topology as shown in FIG. 1A which is non-planar, with surface irregularities above the underlying interconnect lines 16 and 17. In particular, the surface of the gapfill oxide layer 18 is elevated above the interconnects 16 and 17. When the gapfill oxide layer 18 is deposited using HDP CVD, the layer tends to form facets 20 and 22 above the interconnects 16 and 17, respectively. For the narrow interconnects 16, the facets 20 are angled and take on a triangular shape forming a 45 degree angle at the edge of the step of the interconnect 16. It is believed that this shape occurs during HDP CVD due to the sputter etch component associated with the HDP CVD process.

In order to fabricate semiconductor devices with multiple levels of interconnects and/or circuit features, the method of the present invention provides for a planarized surface before the deposition of the next metal interconnect layer. Of particular advantage, the method provides for depositing a sacrificial layer 24 atop the gapfill oxide layer 18 as shown in FIG. 1B. According to the invention, the sacrificial layer 24 exhibits an equal or greater E/D ratio for a given bias (and thus a greater sputter etch rate) than the gap fill oxide layer 18. This provides a great advantage because the E/D ratio, which is a measure of the planarizing capability of the deposition process, can be twice as high for the sacrificial layer 24 than the gap fill oxide 18 for the same rf bias power applied to the wafer support. Materials used for the sacrificial layer are selected such that they exhibit the desirable E/D ratio. Preferably, the sacrificial layer 24 is comprised of a silicon rich oxide. The silicon rich oxide layer is formed by reacting a non-stoichiometric amount of silicon and oxygen containing gases. In an alternative embodiment a pure amorphous silicon layer may be used as the sacrificial layer 24. Preferably, the gases will be reacted using a ratio of oxygen to silicon containing gases of less than 1.2, with a ratio in the range of approximately 0.0 to 1.0 being preferred. Preferably, the sacrificial layer 24 is deposited to a thickness ranging from approximately zero to 2 microns. Further, the sacrificial layer can be comprised of other suitable materials, including low density oxides, oxynitrides, and low dielectric constant materials. Each of these layers will exhibit different etching responses with the chemical etch processes enhancing the ability to selectively planarize the wider line features.

Figure 3:
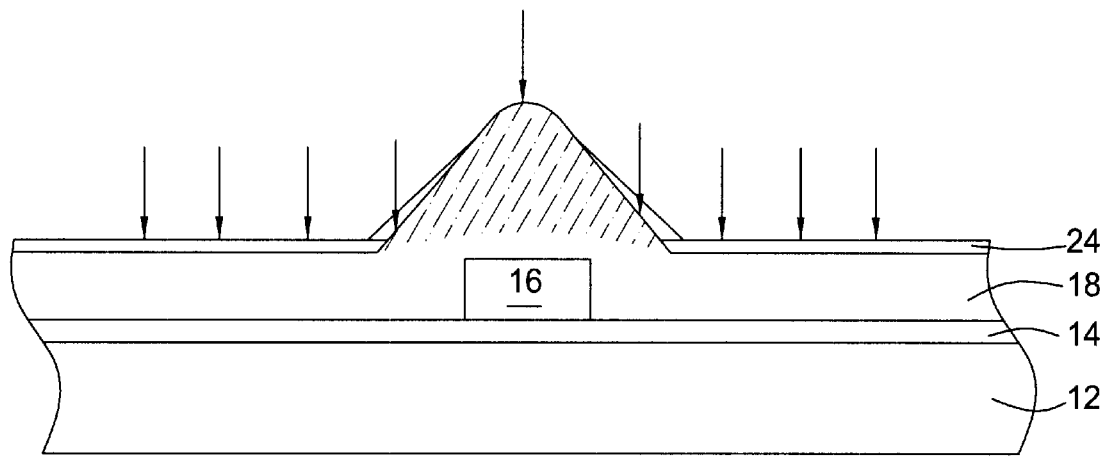
FIG. 3 is a partial cross-sectional view of a semiconductor wafer having one interconnect or feature, and showing planarization of an angled facet in the oxide layer formed atop the interconnect or feature in accordance with the method of the present invention.
Figure 5:
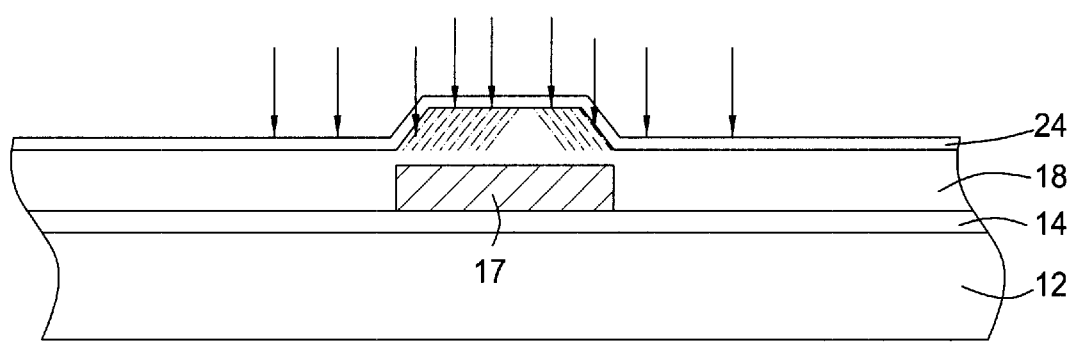
FIG. 5 shows a partial cross-sectional view of a semiconductor wafer having one wide interconnect with an oxide layer deposited atop the interconnect, and showing planarization of a facet in the oxide layer, in accordance with the method of the present invention.

As the sacrificial layer 24 is deposited, the angled facets 20 recede as shown in FIG. 1B. This phenomenon is shown in greater detail with reference to FIGS. 3 and 5. As discussed above, as the etching ions sputter the surface of the layer during deposition the angled facet portion of the layer etches at a greater rate than the rest of the layer that is parallel to the substrate. As this occurs, the facets propagate inwards from each side, thereby reducing the size and height of the facet as shown in FIGS. 3 and 5. For the narrow interconnects 16, the facet is substantially removed during this second deposition step, leaving a substantially planar surface above such interconnects. For the wide interconnect 17, the facet is significantly reduced but may not completely removed. The reduction of the facet occurs because there is no deposition of the sacrificial layer occurring on the facets due to the high E/D ratio. Therefore the facets are subjected to the full sputtering effect of the plasma.

To provide further planarization, the method of the present invention employs a third step where the sacrificial layer 24 is etched back by etching the surface of the layer 24 as shown in FIG. 1C. In the preferred embodiment, the sacrificial layer is etched back by sputter etching. In this step, no deposition occurs. Sputter etching ions are introduced into the HDP CVD reactor, and the wafer support is biased by applying rf bias power thereby causing the ions to sputter etch the surface. Sputter etching ions which are suitable for the method of the present invention include oxygen, nitrogen, and the inert gases, and mixtures of any of the same. Preferably, the etching ions are argon (Ar), however, the other suitable etching species may be used. For example, neon or a mixture of Ar and neon can be used as the sputter etching gas. In an exemplary embodiment, the sacrificial layer 24 is removed by sputter etching with Ar ions for approximately one to two minutes, at a rf bias power density in the range of 1 W/cm$^2$ to 12 W/cm$^2$, to achieve a substantially planar surface. The power density will vary depending on the material being removed and the etching/sputtering chemistry required for suitable planarization.

In another embodiment of the present invention, the sacrificial layer is etched back by a combination of sputter etching and chemical etching. A suitable chemical etchant is introduced along with the sputter etching gas. Suitable chemical etchant include fluorine containing gases, and fluorine containing gases with oxygen additions. For example, $CF_4$, $CHF_3$, $NF_3$, $SF_6$, and their oxygen additions may be used as the chemical component of the etch back step.

Figure 2:
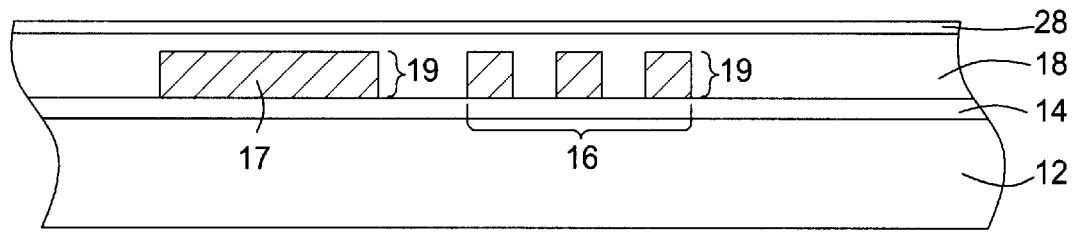
FIG. 2 is a cross-sectional view of the semiconductor wafer and illustrating an additional processing step in accordance with an alternative embodiment of the present invention.

In an alternative embodiment of the present invention, a fourth step may be employed to provide further planarization of the semiconductor device. A "topcoat" layer 28, preferably a gap fill type oxide, is deposited atop the wafer as shown in FIG. 2. In an exemplary embodiment, the topcoat layer 28 is deposited to a thickness of approximately 0.5 to 0.8 microns.

Figure 6:
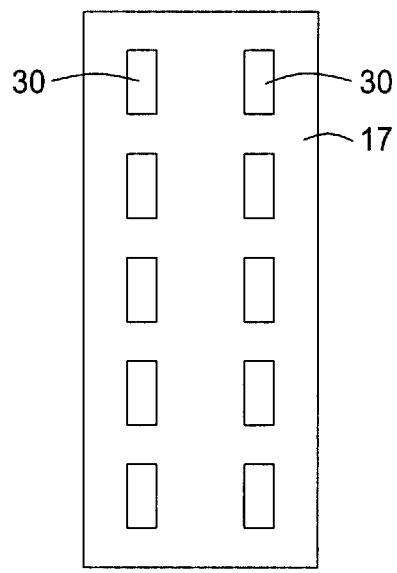
FIG. 6 is a top plan view of a wide interconnect having slotted regions in accordance with another embodiment of the method of the present invention.

The planarization of wide interconnects (greater than 6 microns) has proven to be difficult according to prior art techniques, and has required the use of CMP and other cumbersome prior art techniques. The present invention solves this problem, and provides for in situ planarization of wide interconnects without the need to resort to CMP and other conventional planarizing techniques. Referring again to FIG. 5, it is shown that for wide interconnect lines 17 that are greater than 6 microns in width, the facet 22 is reduced but does not completely propagate during deposition of the sacrificial layer 24. To solve this problem, the present invention employs a "slotting" method. Specifically, as shown in FIG. 6, slots 30 are formed in the wide interconnect line 17 by removing a portion of the interconnect at periodic positions along its length and/or width. Preferably, the slots 30 have the dimensions of approximately 0.3 by 0.3 microns (or the smallest resolvable slot), and are placed approximately every 2.5 $\mu$m or greater along the interconnect 17. The exact dimensions will be a function of the device design and the process. The slots are part of the interconnect design and hence appear on the mask during the metal lithography step. They are then etched out during the metal etch process.

Figure 7:
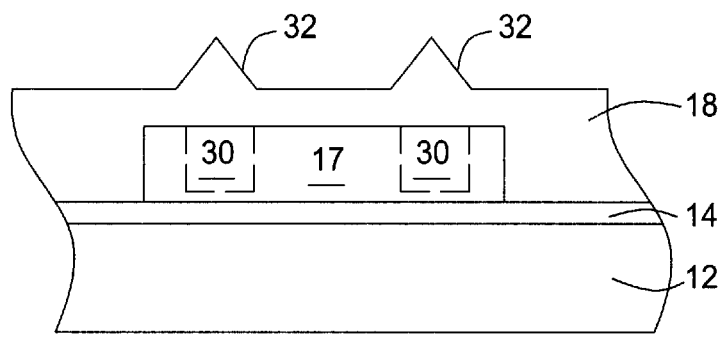
FIG. 7 is a partial cross-sectional view of a semiconductor wafer having a wide interconnect with slotted regions and showing facet formation atop the wide interconnect.

As shown in FIG. 7, the slots 30 effectively break up the deposited dielectric into a series of stepped features which creates a series of individual angled facets 32 resembling the facets 20, as opposed to the one large elongated facet 22. The individual angled facets 32 are then readily planarized using the steps of the invention depicted in FIGS. 1A–1C, and in the alternative embodiment depicted in FIGS. 1A–1C and FIG. 2.

Experimental

A number of experiments were conducted using the method of the present invention to planarize layers on a substrate containing interconnect lines. A variety of interconnect lines were used having a height of 0.8 microns and a width of up to 5 microns. An exemplary embodiment of the method was performed in a HPD CVD reactor using the process conditions shown in Table 1 below:

TABLE 1

| | HDP CVD Process Conditions: | | | |
|---|---|---|---|---|
| | STEP 1 (FIG. 1A) | STEP 2 (FIG. 1B) | STEP 3 (FIG. 1C) | STEP 4 (FIG. 2) |
| Time (secs) | 80 | 110 | 40 | 60 |
| Pressure (mtorr) | 10 | 10 | 5 | 10 |
| Plasma Source Power (watts) | 5000 | 5000 | 5000 | 5000 |
| Bias Power (watts/cm$^2$) | 10.5 | 10.5 | 10.5 | 10.5 |
| Backside Helium Pressure (torr) | 5 | 6 | 6 | 5 |
| Silane gas flow rate (sccm) | 200 | 200 | 0 | 200 |
| Argon gas flow rate (sccm) | 520 | 520 | 520 | 520 |
| Oxygen gas flow rate (sccm) | 490 | 150 | 0 | 490 | where the process conditions labeled STEP 1 are the process conditions for the gapfill oxide deposition step shown in FIG. 1A; the process conditions labeled STEP 2 are the process conditions for the sacrificial oxide deposition step shown in FIG. 1B; and the process conditions labeled STEP 3 are the process conditions for the etchback step shown in FIG. 1C, and using the sputter etch embodiment of the invention. STEP 4 corresponds to the topcoat deposition step as shown in FIG. 2.

In accordance with an exemplary embodiment of the method of the present invention shown in Table 1, the gap fill oxide layer 18 is deposited atop the interconnect lines by HPD CVD using the process conditions at STEP 1 in Table 1. Specifically, the layer 18 was deposited in a HDP CVD reactor of the type described above with a bias power density of 10.5 W/cm$^2$ applied to the wafer support. To provide a good gap fill oxide, the flow rate of silane and oxygen is 200 and 490 sccm, respectively. In this exemplary embodiment, this deposition step takes place for about 80 seconds.

Next, the sacrificial layer 24 is deposited at a bias power density of 10.5 W/cm$^2$ applied to the wafer support as shown at STEP 2 of Table 1. Preferably, the sacrificial layer is a silicon rich oxide layer. To provide a silicon rich oxide layer, the oxygen flow rate is reduced, and in the exemplary embodiment the flow rate of silane and oxygen is 200 and 150 sccm, respectively. The sacrificial layer is deposited for a period of 110 seconds.

The sacrificial layer 24 is then sputter etched using the process conditions at STEP 3 in Table 1 for 40 seconds to substantially remove the sacrificial layer and provide a substantially planar surface. No deposition occurs during this step, only etching, and thus the silane and oxygen flow rates are zero. In this example, argon ions sputter the surface of the sacrificial layer at an argon flow rate of 520 sccm. Also during this step, the pressure in the reactor is reduced to 5 mtorr.

To provide further planarization, the invention provides for deposition of a topcoat 28 atop the wafer using the process conditions at STEP 4 in Table 1. Preferably, the topcoat is of the gap fill oxide type, and is deposited for a period of 60 seconds using a flow rate of silane and oxygen of 200 and 490 sccm, respectively.

It is important to note that while an example has been provided, other process conditions may be used with the method of the present invention. For example, the time periods for deposition may vary depending on the size of the interconnects (or features) underlying the layers to be planarized. Such as, for interconnects that have a line width smaller than 5 microns, or when the interconnects are slotted in accordance with an alternative embodiment of the present invention, the time periods in STEP 2 and STEP 3 will be reduced.

While the invention has been described in connection with specific embodiments, it is evident that many variations, substitutions, alternatives and modifications will be apparent to those skilled in the art in light of the foregoing description. Accordingly, this description is intended to encompass all such variations, substitutions, alternatives and modifications as fall within the spirit of the appended claims.

What is claimed:

1. A method of forming a substantially planar dielectric layer on a semiconductor substrate having interconnect features, using a high density plasma chemical vapor deposition reactor having a wafer support that is RF biased to provide sputter etching, comprising:
   depositing a gap fill oxide layer over the interconnect features and substrate wherein an oxide layer having angled facets are formed above the interconnect features;
   depositing a sacrificial layer over the gap fill oxide layer utilizing process parameters that provide an etch to deposition ratio which substantially etches away the angled facets of the oxide layer; and
   etching the layers to provide a substantially planar layer on said semiconductor substrate.

2. The method of claim 1 further comprising:
   depositing a topcoat oxide layer over said substantially planar layer on said semiconductor substrate.

3. The method of claim 1 wherein the sacrificial layer is comprised of a silicon rich oxide.

4. The method of claim 1 wherein depositing a sacrificial layer comprises:
   reacting a silicon containing gas and an oxygen containing gas wherein the ratio of the oxygen to silicon containing gases is less than 1.2.

5. The method of claim 4 wherein the ratio of the oxygen to silicon containing gases is in the range of approximately 0 to 1.0.

6. The method of claim 4 wherein the ratio of the oxygen to silicon containing gases is in the range of approximately 0.5 to 1.0.

7. The method of claim 1 wherein the width of said interconnects are in the range of 0.1 to 5.0 microns.

8. The method of claim 1 wherein the width of said interconnects are greater than 5 microns, and further comprising:
   slotting said interconnect along its length at intervals of approximately every 2.5 to 4 microns to promote angled facet formation.

9. The method of claim 1 wherein etching the layers comprises a combination of chemical etching and sputter etching.

10. The method of claim 9 wherein the chemical etching uses a chemical etchant selected from the group of fluorine containing gases and fluorine containing gases with oxygen additives.

11. The method of claim 1 wherein etching the layers comprises sputter etching.

12. The method of claim 11 wherein the sputter etching uses a sputter etch gas selected from the group of oxygen, nitrogen, the inert gases, and mixtures thereof.

13. The method of claim 11 wherein the sputter etching uses argon.

14. The method of claim 1 wherein the etch to deposition ratio of said sacrificial layer is at least 75:1.

15. The method of claim 1 wherein the sacrificial layer is selected from the group consisting of: oxy-organic materials, polysilicon, low density oxides, oxynitrides, and materials having a low dielectric constant.

16. The method of claim 1 wherein etching the layers comprises injecting a chemical etchant into said reactor to chemically etch the sacrificial layer.

17. A method of forming a substantially planar dielectric layer on a semiconductor substrate having interconnect features, said layer formed by plasma enhanced CVD, said plasma enhanced CVD including RF bias sputter etching with an associated sputter etch to deposition ratio, comprising the steps of:
   first depositing a gap fill oxide layer over the interconnect features and substrate wherein an oxide layer having angled facets are formed above the interconnect features;
   second depositing a sacrificial silicon rich oxide layer over the gap fill oxide layer utilizing process parameters providing an etch to deposition ratio of at least 50% which substantially etches away the angled facets; and
   sputter etching the layers to provide a substantially planar layer on said semiconductor substrate.

18. The method of claim 17 wherein the step of depositing a sacrificial rich oxide layer further comprises:
   reacting a silicon containing gas and an oxygen containing gas in an oxygen to silicon ratio of less than 1.2 to deposit the silicon rich sacrificial layer over the gap fill oxide.

19. The method of claim 18 wherein the ratio of the oxygen to silicon containing gases is in the range of approximately 0.0 to 1.0.

20. The method of claim 18 wherein the ratio of the oxygen to silicon containing gases is in the range of approximately 0.5 to 1.0.

21. The method of claim 17 wherein the width of said interconnects are in the range of 0.1 to 6.0 microns.

22. The method of claim 17 wherein the width of said interconnects are greater than 6 microns.

23. The method of claim 22 further comprising the step of:
    slotting said interconnect along its length at intervals of approximately every 2.5 microns to promote angled facet formation.

24. The method of claim 17 wherein the step of etching the layers comprises a combination of chemical etching and sputter etching.

25. The method of claim 24 wherein the chemical etching step uses a chemical etchant selected from the group of fluorine containing gases and fluorine containing gases with oxygen additives.

26. The method of claim 24 wherein the step of etching the layers comprises injecting a chemical etchant into said reactor to chemically etch the sacrificial layer.

27. The method of claim 17 wherein the sputter etching step uses a sputter etch gas selected from the group of oxygen, nitrogen, inert gases, and mixtures thereof.

28. The method of claim 17 wherein the sputter etching step uses argon.

* * * * *